United States Patent
Pyeon et al.

(10) Patent No.: US 8,700,818 B2
(45) Date of Patent: Apr. 15, 2014

(54) PACKET BASED ID GENERATION FOR SERIALLY INTERCONNECTED DEVICES

(75) Inventors: Hong Beom Pyeon, Kanata (CA); HakJune Oh, Kanata (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 966 days.

(21) Appl. No.: 11/529,293

(22) Filed: Sep. 29, 2006

(65) Prior Publication Data

US 2008/0080492 A1   Apr. 3, 2008

(51) Int. Cl.
*G06F 3/00* (2006.01)
*G06F 1/12* (2006.01)

(52) U.S. Cl.
USPC ............ 710/25; 710/22; 710/23; 710/24; 710/26; 710/27; 710/28; 713/400; 713/401

(58) Field of Classification Search
None
See application file for complete search history.

(56) References Cited

U.S. PATENT DOCUMENTS

| | | | |
|---|---|---|---|
| 4,135,181 A * | 1/1979 | Bogacki et al. | 340/870.03 |
| 4,174,536 A | 11/1979 | Misunas et al. | |
| 4,617,566 A * | 10/1986 | Diamond | 340/870.11 |
| 4,733,376 A | 3/1988 | Ogawa | |
| 4,796,231 A | 1/1989 | Pinkham | |
| 5,126,808 A | 6/1992 | Montalvo et al. | |
| 5,136,292 A | 8/1992 | Ishida | |
| 5,175,819 A | 12/1992 | Le Ngoc et al. | |
| 5,204,669 A | 4/1993 | Dorfe et al. | |
| 5,243,703 A | 9/1993 | Farmwald et al. | |
| 5,260,977 A * | 11/1993 | Kinoshita | 375/354 |
| 5,280,539 A | 1/1994 | Yeom et al. | |
| 5,319,598 A | 6/1994 | Aralis et al. | |
| 5,365,484 A | 11/1994 | Cleveland et al. | |
| 5,377,228 A * | 12/1994 | Ohara et al. | 375/211 |
| 5,404,460 A * | 4/1995 | Thomsen et al. | 710/9 |
| 5,430,859 A | 7/1995 | Norman et al. | |
| 5,440,694 A | 8/1995 | Nakajima | |
| 5,452,259 A | 9/1995 | McLaury | |

(Continued)

FOREIGN PATENT DOCUMENTS

WO   WO 01/69411 A2   9/2001

OTHER PUBLICATIONS

Samsung Electronics Co. Ltd, "256M x 8 Bit / 128 M x 16 Bit / 512M x 8 Bit NAND Flash Memory", K9K4G08U1M, May 6, 2005, pp. 1-41.

(Continued)

*Primary Examiner* — Henry Tsai
*Assistant Examiner* — Jing-Yih Shyu

(57) ABSTRACT

Various memory devices (e.g., DRAMs, flash memories) are serially interconnected. The memory devices need their identifiers (IDs). Each of the memory devices generates IDs for neighboring memory devices. The IDs are generated synchronously with clock. Command data and previously generated ID data are synchronously registered. The registered data is synchronously output and provided as parallel data for calculation of a new ID for the neighboring device. The calculation is an addition or subtraction by one. The IDs are generated in a packet basis by interpreting serial packet-basis commands received at the serial input in response to clocks. A clock latency is controlled in response to the interpreted ID and the clock. In accordance with the controlled clock latency, a new ID is provided in a packet basis. In high frequency generation applications (e.g., 1 GHz), two adjacent devices connected in daisy chain fashion are guaranteed enough time margin to perform the interpretation of packet commands.

21 Claims, 13 Drawing Sheets

(56) References Cited

U.S. PATENT DOCUMENTS

| | | | |
|---|---|---|---|
| 5,473,563 A | 12/1995 | Suh et al. | |
| 5,473,566 A | 12/1995 | Rao | |
| 5,473,577 A | 12/1995 | Miyake et al. | |
| 5,535,336 A | 7/1996 | Smith et al. | |
| 5,596,724 A | 1/1997 | Mullins et al. | |
| 5,602,780 A | 2/1997 | Diem et al. | |
| 5,636,342 A * | 6/1997 | Jeffries | 714/48 |
| 5,671,178 A | 9/1997 | Park et al. | |
| 5,721,840 A | 2/1998 | Soga | |
| 5,740,379 A | 4/1998 | Hartwig | |
| 5,761,146 A | 6/1998 | Yoo et al. | |
| 5,771,199 A | 6/1998 | Lee | |
| 5,802,006 A | 9/1998 | Ohta | |
| 5,806,070 A | 9/1998 | Norman et al. | |
| 5,809,013 A | 9/1998 | Kackman | |
| 5,818,785 A | 10/1998 | Ohshima | |
| 5,828,899 A | 10/1998 | Richard et al. | |
| 5,835,935 A | 11/1998 | Estakhri et al. | |
| 5,859,809 A | 1/1999 | Kim | |
| 5,872,994 A | 2/1999 | Akiyama et al. | |
| 5,914,957 A * | 6/1999 | Dean et al. | 370/438 |
| 5,937,425 A | 8/1999 | Ban | |
| 5,941,974 A | 8/1999 | Babin | |
| 5,959,930 A | 9/1999 | Sakurai | |
| 5,995,417 A | 11/1999 | Chen et al. | |
| 5,999,023 A * | 12/1999 | Kim | 327/144 |
| 6,002,638 A | 12/1999 | John | |
| 6,085,290 A | 7/2000 | Smith et al. | |
| 6,091,660 A | 7/2000 | Sasaki et al. | |
| 6,107,658 A | 8/2000 | Itoh et al. | |
| 6,144,576 A | 11/2000 | Leddige et al. | |
| 6,148,364 A | 11/2000 | Srinivasan et al. | |
| 6,178,135 B1 | 1/2001 | Kang | |
| 6,188,262 B1 * | 2/2001 | Sutherland | 327/295 |
| 6,304,125 B1 * | 10/2001 | Sutherland | 327/295 |
| 6,304,921 B1 | 10/2001 | Rooke | |
| 6,317,350 B1 | 11/2001 | Pereira et al. | |
| 6,317,352 B1 | 11/2001 | Halbert et al. | |
| 6,317,812 B1 | 11/2001 | Lofgren et al. | |
| 6,339,800 B1 * | 1/2002 | Won et al. | 710/33 |
| 6,438,064 B2 | 8/2002 | Ooishi | |
| 6,442,098 B1 | 8/2002 | Kengeri | |
| 6,442,644 B1 | 8/2002 | Gustavson et al. | |
| 6,510,503 B2 * | 1/2003 | Gillingham et al. | 711/167 |
| 6,535,948 B1 | 3/2003 | Wheeler et al. | |
| 6,567,878 B2 * | 5/2003 | Wettroth et al. | 710/305 |
| 6,584,303 B1 | 6/2003 | Kingswood et al. | |
| 6,594,183 B1 | 7/2003 | Lofgren et al. | |
| 6,601,199 B1 | 7/2003 | Fukuda et al. | |
| 6,611,466 B2 | 8/2003 | Lee et al. | |
| 6,658,509 B1 | 12/2003 | Bonella et al. | |
| 6,658,582 B1 | 12/2003 | Han | |
| 6,680,904 B1 | 1/2004 | Kaplan et al. | |
| 6,715,044 B2 | 3/2004 | Lofgren et al. | |
| 6,718,432 B1 | 4/2004 | Srinivasan | |
| 6,732,221 B2 | 5/2004 | Ban | |
| 6,754,807 B1 | 6/2004 | Parthasarathy et al. | |
| 6,763,426 B1 | 7/2004 | James et al. | |
| 6,807,103 B2 | 10/2004 | Cavaleri et al. | |
| 6,816,933 B1 | 11/2004 | Andreas | |
| 6,850,443 B2 | 2/2005 | Lofgren et al. | |
| 6,850,992 B2 * | 2/2005 | Heinrich et al. | 710/3 |
| 6,853,557 B1 | 2/2005 | Haba et al. | |
| 6,853,573 B2 | 2/2005 | Kim et al. | |
| 6,928,501 B2 * | 8/2005 | Andreas et al. | 710/110 |
| 6,944,697 B2 | 9/2005 | Andreas | |
| 6,950,325 B1 | 9/2005 | Chen | |
| 6,967,874 B2 | 11/2005 | Hosono | |
| 6,996,644 B2 | 2/2006 | Schoch et al. | |
| 7,032,039 B2 | 4/2006 | DeCaro | |
| 7,096,287 B1 * | 8/2006 | Champagne et al. | 710/104 |
| 7,139,839 B2 * | 11/2006 | White et al. | 709/245 |
| 7,652,922 B2 * | 1/2010 | Kim et al. | 365/185.11 |
| 8,010,714 B2 * | 8/2011 | Simon | 710/9 |
| 2002/0121922 A1 * | 9/2002 | Greenstreet et al. | 327/211 |
| 2002/0188781 A1 | 12/2002 | Schoch et al. | |
| 2003/0074505 A1 | 4/2003 | Andreas et al. | |
| 2003/0088655 A1 * | 5/2003 | Leigh et al. | 709/223 |
| 2003/0128702 A1 * | 7/2003 | Satoh et al. | 370/390 |
| 2004/0001380 A1 | 1/2004 | Becca et al. | |
| 2004/0019736 A1 | 1/2004 | Kim et al. | |
| 2004/0024960 A1 | 2/2004 | King et al. | |
| 2004/0039854 A1 | 2/2004 | Estakhri et al. | |
| 2004/0093450 A1 * | 5/2004 | Andreas | 710/110 |
| 2004/0148482 A1 * | 7/2004 | Grundy et al. | 711/167 |
| 2004/0199721 A1 | 10/2004 | Chen | |
| 2004/0230738 A1 | 11/2004 | Lim et al. | |
| 2005/0094591 A1 * | 5/2005 | Kwon | 370/321 |
| 2005/0160218 A1 | 7/2005 | See et al. | |
| 2005/0213421 A1 | 9/2005 | Polizzi et al. | |
| 2005/0273539 A1 | 12/2005 | Yamamoto | |
| 2006/0050594 A1 | 3/2006 | Park | |
| 2006/0088044 A1 * | 4/2006 | Hammerl | 370/402 |
| 2006/0200602 A1 | 9/2006 | James | |
| 2007/0162615 A1 * | 7/2007 | Rusu | 709/245 |
| 2007/0165457 A1 * | 7/2007 | Kim | 365/185.11 |
| 2007/0234071 A1 * | 10/2007 | Pyeon | 713/190 |
| 2007/0250648 A1 * | 10/2007 | Picard et al. | 710/9 |
| 2008/0028176 A1 * | 1/2008 | Bartley et al. | 711/167 |
| 2008/0181214 A1 | 7/2008 | Pyeon et al. | |
| 2011/0032932 A2 | 2/2011 | Pyeon et al. | |

OTHER PUBLICATIONS

Toshiba, "2GBIT (256M x 8 Bits) CMOS NAND E2PROM", TH58NVG1S3AFT05, May 19, 2003, pp. 1-32.

Amtel Corp., "High Speed Small Sectored SPI Flash Memory", pp. 1-22, 2006.

64 Megabit CMOS 3.0 Volt Flash Memory with 50MHz SPI.

King, et al., "Communicating with Daisy Chained MCP42XXX Digital Potentiometers", Microchip AN747, pp. 1-8, 2001.

Intel Corporation, "Intel® Advanced+ Boot Block Flash Memory (C3)", May 2005, pp. 1-72.

M-Systems Flash Disk Pioneers Ltd., "DiskOnChip H1 4Gb (512MByte) and 8Gb (1 GByte) High Capacity Flash Disk with NAND and x2 Technology", Data Sheet, Rev. 0.5 (Preliminary), pp. 1-66, 2005.

Tal, A., "Guidelines for Integrating DiskOnChip in a Host System", AP-DOC-1004, Rev. 1.0, M-Systems Flash Pioneers Ltd., pp. 1-15, 2004.

Samsung Electronics Co. Ltd, OneNAND4G(KFW4G16Q2M-DEB6), OneNAND2G(KFH2G16Q2M-DEB6), OneNAND1G(KFW1G16Q2M-DEB6) Flash Memory, OneNAND™ Specification Ver. 1.2, pp. 1-125, Dec. 23, 2005.

Kennedy, J., et al., "A 2Gb/s Point-to-Point Heterogeneous Voltage Capable DRAM Interface for Capacity-Scalable Memory Subsystems", ISSCC 2004/Session 1/DRAM/11.8, IEEE International Solid-State Circuits Conference, Feb. 15-19, 2004, vol. 1, pp. 214-523.

Kim, Jae-Kwan, et al., "A 3.6Gb/s/pin Simultaneous Bidirectional (SBD) I/O Interface for High-Speed DRAM", ISSCC 2004/Session 22/DSL and Multi-Gb/s I/O 22.7, IEEE International Solid-State Circuits Conference Feb. 15-19, 2004, vol. 1, pp. 414-415.

"HyperTransport TM I/O Link Specification", Revision 2.00, Document No. HTC20031217-0036-00, Hypertransport Technology Consortium, pp. 1-325, 2001.

"IEEE Standard for High-Bandwidth Memory Interface Based on Scalable Coherent Interface (SCI) Signaling Technology (RamLink)", IEEE Std. 1596.4-1996, the Institute of Electrical Electronics Engineers, Inc., pp. i-91, (Mar. 1996).

Oshima, et al., "High-Speed Memory Architectures for Multimedia Applications", Circuits & Devices, IEEE 8755-3996/97, pp. 8-13, Jan. 1997.

Gjessing, S., et al., "RamLink: A High-Bandwidth Point-to-Point Memory Architecture", Proceedings CompCom 1992, IEEE 0/8186-2655-0/92, pp. 328-331, Feb. 24-28, 1992.

(56) References Cited

OTHER PUBLICATIONS

Gjessing, S., et al., "Performance of the RamLink Memory Architecture", Proceedings of the Twenty-Seventh Annual Hawaii International Conference on System Sciences, IEEE 1060-3425/94, pp. 154-162, Jan. 1994.

Gjessing, S., et al., "A RAM Link for High Speed", Special Report/Memory, IEEE Spectrum, pp. 52-53, Oct. 1992.

Diamond, S.L., "SyncLink: High: High-speed DRAM for the Future", Micro Standards, IEEE Micro, pp. 74-75, Dec. 1996.

Samsung Electronics, "DDR2 Fully Buffered DIMM 240pin FBDIMMS based on 512Mb C-die" Rev. 1.3, Sep. 2006, pp. 1-32, Sep. 2006.

"HyperTransport TM I/O Link Specification", Revision 3.00, Document No. HTC20051222-0046-0008, Hypertransport Technology Consortium, pp. 1-428, Apr. 2006.

"8-megabit 2.5-volt Only or 2.7-volt Only DataFlasha®," Technical Specification, Atmel, Rev. 2225H-DFLSH (2004).

Samsung Electronics, "K9XXG08UXM Preliminary Flash Memory," Technical Specification, Samsung Electronics.

"1024K$I^2$C™ CMOS Serial EEPROM," Technical Specification, Microchip Technology Inc., (2006).

"The $I^2$C-Bus Specification," Version 2.1, Philips Semiconductors, Jan. 2000.

"16 Mbit LPC Serial Flash," Preliminary Specification, Silicon Storage Technology Inc., (2006).

"16 Mbit SPI Serial Flash," Preliminary Specification, Silicon Storage Technology Inc., (2005).

"2Mbit, Low Voltage, Serial Flash Memory with 40 Mhz SPI Bus Interface," Technical Specification, STMicroelectronics Group of Companies (2005).

"NAND Flash Applications Design Guide," Revision 1.0, Toshiba America Electronics Components, Inc., (Apr. 2003).

* cited by examiner

PACKET BASED ID GENERATION FOR SERIALLY INTERCONNECTED DEVICES

FIELD OF THE INVENTION

The present invention relates generally to serially interconnected devices and in particular to an apparatus and a method for generating a device identifier (ID) for serially interconnected devices, for example memory devices, and to an apparatus utilizing such a method.

BACKGROUND OF THE INVENTION

Memory systems on system boards are designed to incorporate higher density and faster operation due to the demands of applications that operate on the system boards. Two design techniques that may be employed to incorporate higher density of a memory system on a system board include using serial interconnection configurations such as daisy chain cascading and parallel interconnection configurations such as multi-dropping. These design techniques may be used to overcome density issues that relate to the cost and operating efficiency of memory swapping between a hard disk and a memory system. Multi-dropping has a shortcoming relative to the daisy chain cascading of memory systems. In particular, if the number of devices in a multi-drop memory system increases, delay time increases as a result of a loading effect of each pin. Moreover, the total performance of multi-drop configurations is degraded by wire resistor-capacitor (RC) loading and the pin capacitance of the memory device.

The use of serialized port connections on system boards has become commonplace in electronic products to reduce interference noise and to reduce board implementation size. The device identifier (ID) assignment of a memory device connected in a serial configuration has been performed with additional pin-by-pin connections to Vdd and Vss so that an ID number can be easily assigned to each device on a cascaded chain. However, this approach requires more pins to make a hard-wired ID number on the system board.

U.S. Pat. No. 5,404,460 granted to Thomsen et al. on Apr. 4, 1995 discloses the configuration of multiple identical serial I/O devices connected in a daisy chain fashion on a serial bus and the generation of device numbers. In the configuration, at power-up or reset, the end I/O device configures itself as Device 0 and provides data to the next device to configure as that device as Device 1. Device 1 provides data to configure the next device as Device 2 and so on. As such, all devices in the chain are assigned a device number. Therefore, all devices are configured to unique addresses without additional external pins or intervention by a system controller. The data is transmitted in a six bit packet. The first three bits consist of the start bit and two packet bits which represent command. The following bits are used as ID bits followed by a stop bit. There is an optional bit. Due to the sequential serial stream on a daisy chain, during one cycle, packet command input processing and the generation of a new command for the next device needs to take place within one clock cycle.

SUMMARY OF THE INVENTION

A serial link in a device, such as a memory device, may utilize a single pin input that receives all address, command, and data serially. According to embodiments of the present invention, there is provided an apparatus for making a serial daisy chain cascading configuration and for controlling command bits, address bits, and data bits effectively through the cascading configuration. By providing a serial daisy chain cascading configuration, the embodiment advantageously obviates having to employ many pins to carry data. Moreover, the technique enhances bandwidth due to less interference among data lines which typically occurs in systems employing a parallel data connection of a memory device at a system board level. In addition, less noise enables high frequency (fast) operation at the system board level to be achieved.

In some embodiments, the IDs are generated in a packet basis by interpreting serial packet-basis commands received at the serial input in response to clocks. A clock latency is controlled in response to the interpreted ID and the clock. In accordance with the controlled clock latency, a new ID is provided in a packet basis. In a high frequency generation (e.g., 1 GHz), two adjacent devices connected in a daisy chain fashion provide enough time margin to perform the interpretation of packet commands.

According to one broad aspect, the invention provides an apparatus comprising: a plurality of devices in a serial interconnection configuration, each device having a serial input connection (SI) for receiving serial input data and a serial output connection (SO) for providing serial output data, at least one of the devices having a packet based processing circuit for receiving a first packet containing a first ID (device identifier), generating a second ID as a function of the first ID and generating a second packet containing the second ID for transmission to another device in response to clocks such that there is a time gap between receiving the first packet and the transmission of the second packet.

In some embodiments, in respect of each device having a packet based processing circuit, the first ID is established as the ID of that device, and the second ID is to be established as the ID of the other device.

In some embodiments, in respect of each device having a packet based processing circuit, the second ID is established as the ID of the that device.

In some embodiments, each device comprises: an input/output data processing circuit for processing serial input data provided through the serial input connection, and generating serial output data to be sent through the serial output connection, the second packet being provided to the other device through the serial output connection for the at least one of the devices.

In some embodiments, the input/output data processing circuit comprises: an interpreter circuit for interpreting serial packet-based commands received at the serial input connection and for providing an interpreted ID as said first ID in response to the clock.

In some embodiments, the input/output data processing circuit further comprises: an ID generation circuit for performing a calculation based on the first ID to produce the second ID.

In some embodiments, the ID generation circuit comprises: a calculation circuit for adding a predetermined increment value to the first ID to provide the second ID.

In some embodiments, the ID generation circuit comprises: a calculation circuit for subtracting a predetermined decrement value to the first ID to provide the second ID.

In some embodiments, the interpreter circuit comprises: a serial packet interpreter for interpreting the serial packet-basis commands to provide interpreted packet commands and for further interpreting the interpreted packet commands to provide the interpreted ID In some embodiments, the input/output data processing circuit further comprises: a controller for controlling a clock latency in response to the interpreted ID and the clock to provide a clock latency control signal, the clock latency control signal controlling the output of the second packet such that there is a time gap between receiving the first packet and the transmission of the second packet.

In some embodiments, the controller comprises: a clock delay element (D-FFs) including a series-connected selectable time delay circuits and a selection circuit for selecting a combination of the selectable time delay circuits, in response to a latency control signal (CLC).

In some embodiments, the controller further comprises: at least one clock delay element that does not require selection and introduces a fixed delay.

In some embodiments, the command interpreter generates the CLC.

In some embodiments, the input/output data processing circuit further comprises: a packet output circuit for outputting an packet based ID in accordance with the new ID, in response to the clock latency control signal and the clock, the output packet based ID being provided to the serial output.

In some embodiments, the device comprises a memory for storing data.

In some embodiments, the memory includes a DRAM, a SRAM or flash memory.

In some embodiments, each device further comprises an ID register for storing the first ID, thereafter the device being adapted to treat the first ID as the ID for the device.

According to another broad aspect, the invention provides a method for generating a device identifier (ID) coupled to one of a plurality of devices in a serial interconnection configuration, the one device having a serial input connection for receiving serial input data and a serial output connection for providing serial output data, the method comprising: receiving a first packet containing a first ID to be used as a device identifier; generating a second ID as a function of the first ID for another device; sending a second packet containing the packet based ID for the other device, the first and second packets being non-overlapped in time.

In some embodiments, the method further comprises: interpreting serial packet-basis commands received at the serial input to provide an interpreted ID as said first ID in response to a clock.

In some embodiments, the step of generating further comprises: performing a calculation based on the interpreted ID to generate the second ID.

In some embodiments, the step of performing a calculation comprises: adding a predetermined increment value to the interpreted ID to provide the second ID.

In some embodiments, the step of interpreting comprises: interpreting the serial packet-basis commands to provide interpreted packet commands; and further interpreting the interpreted packet commands to provide the interpreted ID.

In some embodiments, the method further comprises: controlling a clock latency in response to the interpreted ID and the clock to provide a clock latency control signal, so that the packets for two devices are non-overlapped in time.

According to another broad aspect, the invention provides a method for generating a device identifier (ID) at a first device coupled to a second device in a serial interconnection configuration, the first device having serial input connection coupled to serial output connection of a previous device in the serial interconnection configuration and the second device having serial input connection coupled to serial output connection of the first device, the method comprising: receiving a command to write an ID in the first device in a first packet; generating a device ID from signal received at the serial input connection of the first device in a packet basis in response to a clock; and transferring the generated device ID to the second device from the serial output connection of the first device to the serial input connection of the second device in a second packet, the first and second packets being non-overlapped in time.

In some embodiments, the method further comprises: interpreting the received command to obtain the ID for the device; controlling clock latency between interpreted serial input and the clock, so that the first and second packets are non-overlapped in time; generating the device ID in response to the controlled clock latency and the new ID, the generated ID being provided through the serial output connection.

In some embodiments, the devices are in memory devices having memory portions for storing data that is accessed in a normal operation mode.

According to another broad aspect, the invention provides a latency controller for use in an apparatus comprising a plurality of devices in a serial connected arrangement, each device having a serial input connection (SI) for receiving serial input data and a serial output connection (SO) for providing serial output data, at least one of the devices having a packet based processing circuit for receiving a first packet containing a first ID (device identifier) for the device, generating a second ID for another one of the devices and generating a second packet containing the second ID for transmission to the other device in response to clocks, the latency controller comprising: a control circuit for controlling a clock latency in response to a received ID and the clock to provide a clock latency control signal, the clock latency control signal being used to ensure the first and second packets are non-overlapped in time.

According to another broad aspect, the invention provides an apparatus for generating a device identifier (ID) at a first device coupled to a second memory device in a serial interconnection configuration, the first device having serial input connections coupled to serial output connections of a previous device in the serial interconnection configuration and the second device having serial input connections coupled to serial output connections of the first device, the apparatus comprising: an ID production circuit for producing a device ID from signals received at the serial input connections of the first device in a packet basis; a transfer circuit for transferring the generated device ID in a packet to the second device from the serial output connections of the first device to the serial input connections of the second device, packets containing IDs for two devices being non-overlapped in time.

According to another broad aspect, the invention provides an ID producing apparatus for producing a device identifier (ID) coupled to one of a plurality of devices in a serial interconnection configuration, the one device having at least one cell for storing data, the one device having a serial input connection for receiving serial input data and a serial output connection for providing serial output data, the apparatus comprising: an input registration circuit for registering serial N-bit ID data contained in the serial input data and for providing the registered N-bit ID data as parallel N-bit ID data, N being an integer that is one or greater than one; a calculating circuit for performing a calculation based on the parallel N-bit ID data and given number data to provide N-bit calculation data as a generated device ID; a parallel-serial circuit for registering the N-bit calculation data as parallel N-bit calculated data and for providing the registered parallel N-bit calculated data as serial N-bit data, the serial N-bit data being forwarded to an input registering circuit included in another generating apparatus coupled to another device; and a transfer circuit for transferring the N-bit calculation data to the second device from the serial output connections of the first device to the serial input connections of the second device.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

In the following detailed description of sample embodiments of the technique, reference is made to the accompanying drawings which form a part hereof, and in which is shown by way of illustration specific sample embodiments in which the technique may be practiced. These embodiments are described in sufficient detail to enable those skilled in the art to practice the technique, and it is to be understood that other embodiments may be utilized and that logical, mechanical, electrical, and other changes may be made without departing from the scope of the technique. The following detailed description is, therefore, not to be taken in a limiting sense, and the scope is defined by the appended claims.

In general, the one cycle latency between two adjacent devices connected in a daisy chain fashion as provided by the configuration taught by the above-referenced Thomson et al. may not provide enough time margin to perform the interpretation and generation of packet commands in a manner that is suitable for systems operating at high frequency, e.g., over 1 GHz. Generally, the present invention relates to a device identifier (ID) generation which is implemented in serial daisy chain cascading arrangement of various memory devices (e.g., DRAMs, flash memories). The memory devices need their identifiers (IDs). Each of the memory devices generates IDs for next memory devices and transmits the generated IDs between devices in a manner that at each device, an incoming packet containing an ID does not overlap in time with outgoing packet containing an ID for a next device.

In some implementations, to begin, input command data and previously generated ID data are synchronously registered. The registered data is synchronously output and provided as parallel data for calculation of a new ID for the next device. The calculated parallel ID data is synchronously output as serial data which is transferred to the next device. The calculation may for example be the addition or subtraction by a predetermined value (e.g., one) for generating the ID. The maximum ID bit number is determined by the bit sizes of the register and calculator, not the number of physical pins. Therefore, a large number of IDs can be generated and a large number of memory devices can be connected in a single serial interconnection configuration.

An embodiment of the present invention will now be described as a daisy chain cascading of devices. In accordance with an embodiment of the present invention, a packet based ID generation employs packets that have a command field that is set to indicate ID generation to indicate that an ID is being transferred to the next device. Specific examples are detailed below.

Figure 1:
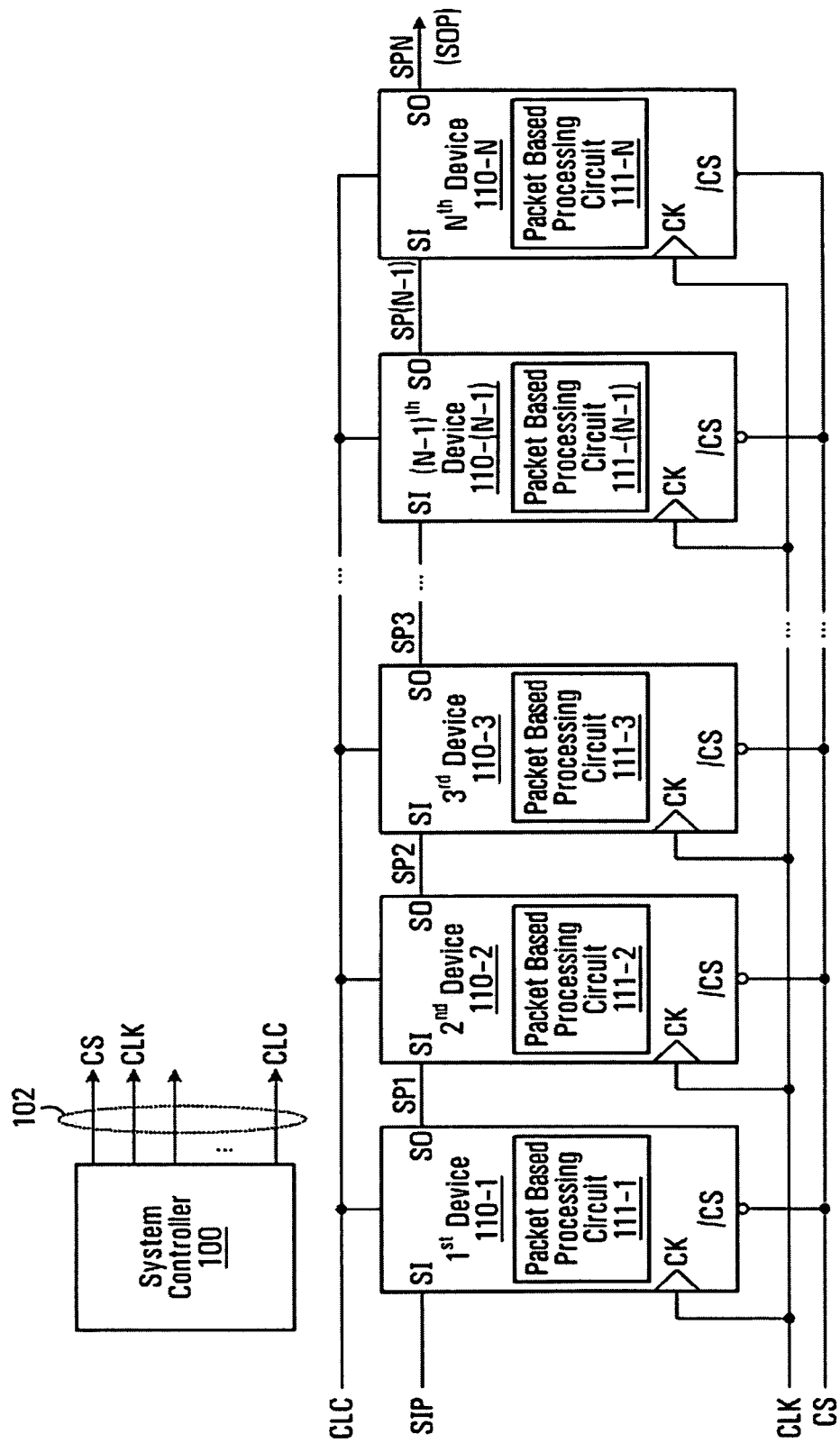
FIG. 1 is a block diagram of memory devices employing a daisy chain cascading connection according to an embodiment of the present invention.

FIG. 1 shows a system including memory devices employing a daisy chain cascading connection according to an embodiment of the present invention. Referring to FIG. 1, a system controller 100 provides a plurality of signals 102 to N memory devices 110-1-110-N. The signals 102 include a chip select signal CS, a serial clock signal CLK and a clock latency control signal CLC. The N memory devices 110-1-110-N are serially connected in a cascaded manner. Each of the N devices 110-1-110-N has a respective serial input (SI) and a respective serial output (SO). The input to the serial input of the first device 110-1 is labelled SIP, this constituting the overall serial input for the system. The signal transferred from the first device 110-1 to the second device 110-2 is labelled SP1. The remaining signals are similarly labelled with the signal between the N-1th device and the Nth device being labelled SP (N-1) and the signal output by the last device 110-N being labelled SPN this also constituting the overall output (SOP) of the system. The clock signal CLK is commonly fed to the N devices 110-1-110-N. In this embodiment, the chip select signal CS is commonly fed to enable all devices at the same time, so that input data of each device is transferred to the next device simultaneously in all of the devices. Also, the clock latency control signal CLC is commonly fed to the devices to control the clock latency in each of the devices. The memory devices may for example be DRAM (dynamic random access memory) devices, SRAM (static random access memory) devices and/or flash memory devices.

Figure 2:
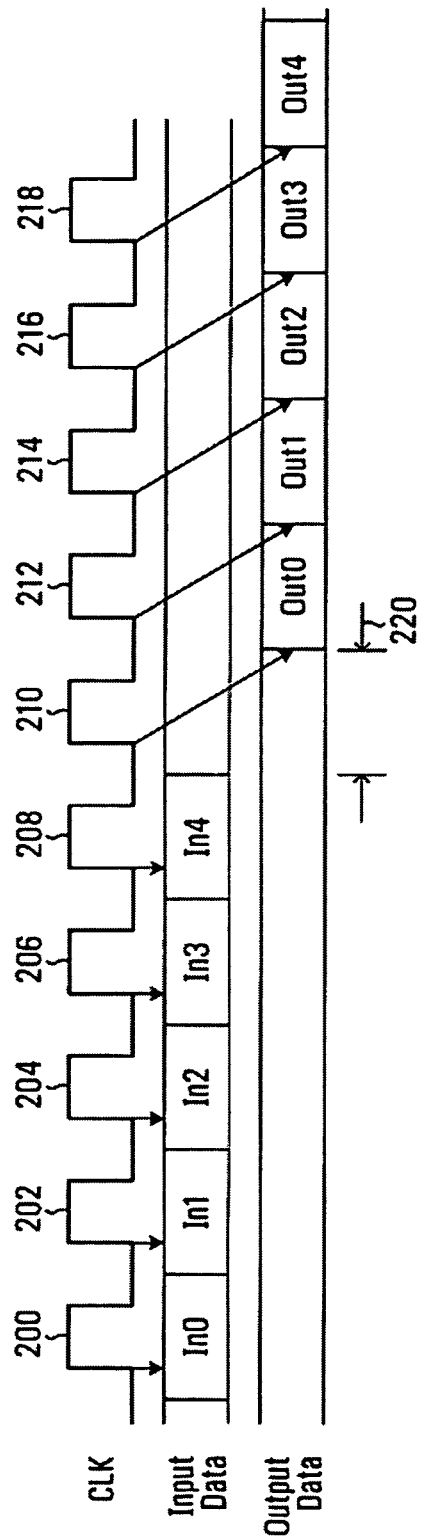
FIG. 2 is an illustration of a timing diagram of single data rate (SDR) operation of the memory devices shown in FIG. 1.

FIG. 2 is an exemplary timing diagram for a single data rate (SDR) mode of operation. All data types (device number data, command data, address data, input data) can be processed through the SDR operation. During a first set of clock cycles data from the serial input is read into the device. In the example of FIG. 2, this takes place over five clock cycles 200, 202, 204, 206, 208 and input data In0, In1, In2, In3, In4 are input to the device. During the next set of clock cycles, data is output by the device. In the illustrated example, there are five clock pulses 210, 212, 214, 216, 218 that result in the output of output data Out0, Out1, Out2, Out3, Out4. In the illustrated example, it is the rising edge of the clock pulse that triggers the input or output of data, but other implementations are possible. Furthermore, while the timing diagram of FIG. 2 shows five bits being input and output, other implementations may use different numbers of bits. There is a delay between the last input bit being read in and the output of the first output bit as indicated at 220.

Figure 3A:
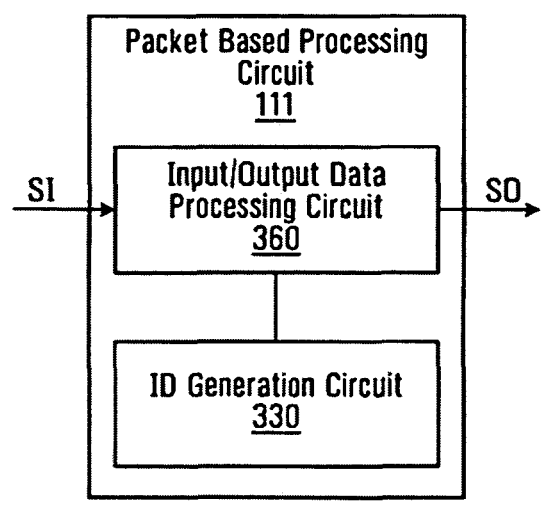
FIGS. 3A and 3B are block diagrams illustrating packet based processing circuits according to embodiments of the present invention.
Figure 3B:
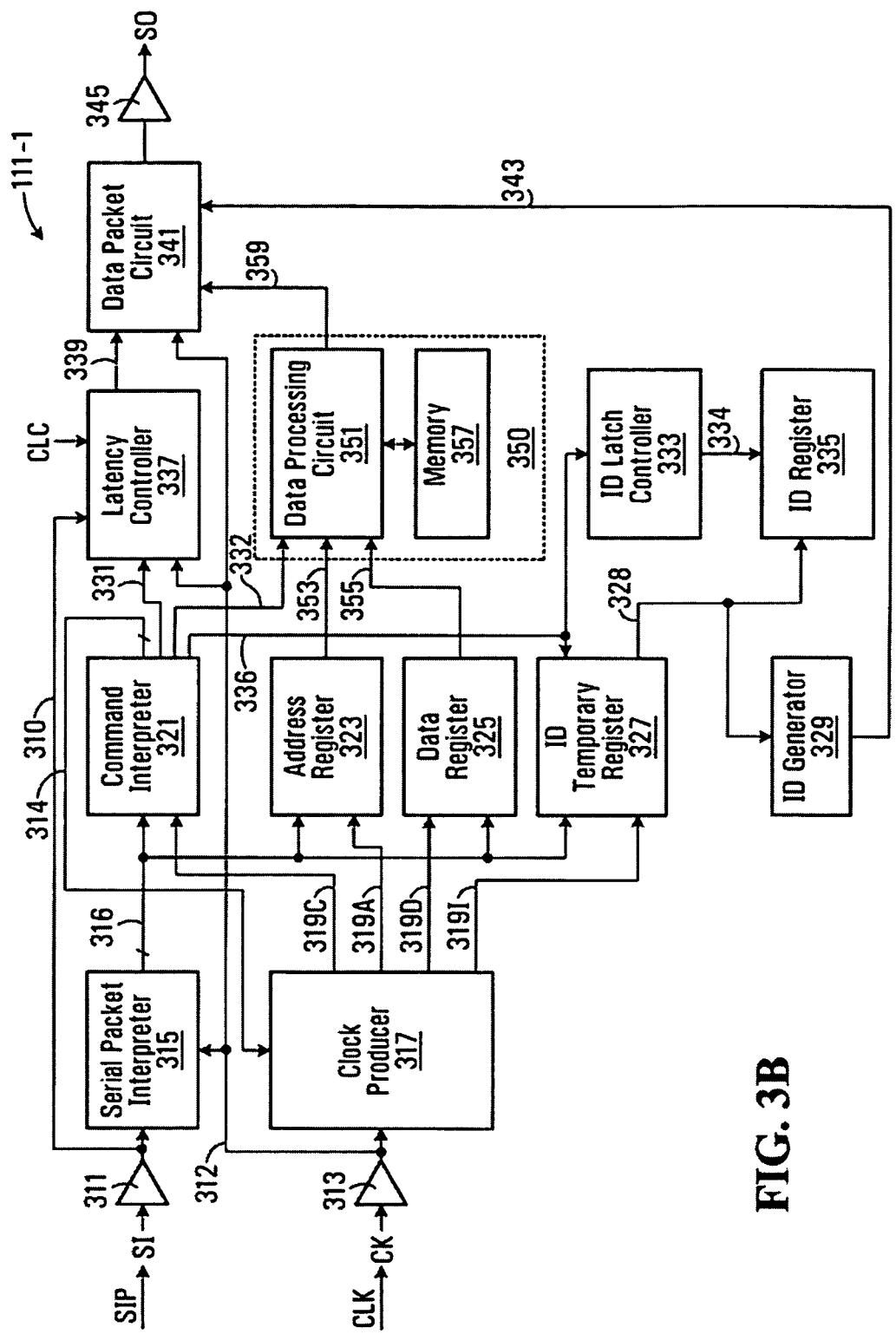

The devices 1101-110-N shown in FIG. 1 include respective packet based processing circuits 111-1-111-N. FIG. 3A shows an example implementation of packet based processing circuit 111-1 included in the first device 110-1, this including both circuitry for the ID generation described below, and other circuitry associated with the device's operation as a memory. The other devices include the same data ID generator circuit as shown in FIG. 3A. FIG. 3B shows another example implementation of packet based processing circuit 111-1. The ID generator circuit performs an ID generation to enhance the performance with synchronous operation. The circuit includes a latency control function that introduces a controllable latency between the receipt of an ID generation command packet from a preceding device and the transmission of an ID generation command packet to a next device so as to avoid overlapping for two adjacent devices. The circuit has an ID generation mode during which IDs are generated as detailed below. After all of the serially interconnected devices have their IDs, they begin to operate in normal mode during which any of the devices are individually addressable through the serial interconnections.

Referring to FIG. 3A, an example implementation of a packet based processing circuit 111 is shown. There is an input/output data processing circuit 360, and an ID generation circuit 330. The input/output data processing circuit 360 receives a packet via serial input SI, and generates a packet for transmission on serial output SO after a time gap. The ID generation circuit generates the ID for the next circuit in the serial arrangement of circuits. Of course, there may be additional functions not shown.

Referring to FIG. 3B, another example of a packet based processing circuit is shown, this being significantly more detailed. Data on the serial input port (SIP) is fed through a serial input buffer 311. The clock signal CLK is fed through a clock input buffer 313 that provides an internal clock signal 312. In this example, each of the input buffers 311 and 313 has an inherent signal delay and thus, its output signal is slightly delayed from its input signal. A delayed output signal from the input buffer 311 is provided as an internal serial input data signal 310. Similarly, a delayed output signal from the input buffer 313 is provided as the internal clock signal 312. A serial packet interpreter 315 receives the SIP data through the serial input buffer 311 that provides the internal serial input data signal 310. Generally, packet based serial input does not have any supplemental input enable pins to designate the start point and/or end point of a packet. Instead of hard pins, the SIP data contains start and end bits that function similar to IPE (input port enable). So as to detect the packet start and end, the serial packet interpreter 315 is used. Depending upon a given implementation, the packet start and end bits could be a single bit or multiple complicated patterns that provide correct operation start and end points without errors. The serial packet interpreter 315 provides a serial packet interpreted output signal 316 in response to the internal clock signal 312 described above. The serial packet interpreted output signal 316 contains a plurality of bits: command bits, address bits, data bits and ID bits.

A clock producer 317 receives the clock signal CLK through the clock input buffer 313. The clock producer 317 also receives a clock generation control signal 314 from a command interpreter 321. For packet based ID generation using the circuit 111-1 of FIG. 3B, all of the operations are related and synchronized with the clocks produced by the clock producer 317. The clock producer 317 produces a command clock signal 319C for the command interpreter 321, an address clock signal 319A for an address register 323, a data clock signal 319D for a data register 325 and an ID clock signal 319I for an ID temporary register 327.

The command interpreter 321 receives the serial packet interpreted output signal 316 from the serial packet interpreter 315 and responds to the command clock signal 319C. From the serial packet interpreter 315, only command related bits are sent to the command interpreter 321 for decoding. The command interpreter 321 also provides the clock generation control signal 314 to the clock producer 317. A specific command is defined to indicate that packet contains an ID. The actual details of the command are implementation specific; suffice it to say, that the ID generation command simply needs to be distinguishable from other commands.

If any command needs addresses, the packet will also contain address bits. The address bits output by the serial packet interpreter are registered in the address register 323 that responds to the address clock signal 319A. The address register 323 is not involved during ID generation mode. Only normal operations, such as, write or read, will utilize the address register 323. Like address register, the data register 325 is for a normal operation with the clock signal. The data bits contained in the serial packet interpreted output signal 316 to be written into a memory are stored in the data register 325 in response to the data clock signal 319D.

The ID temporary register 327 receives the serial packet interpreted output signal 316 and the ID clock signal 319I. In the ID generation mode, the ID bits contained in the serial packet interpreted output signal 316 are registered in the ID temporary register 327 in response to the ID clock signal 319I. ID generation is performed by an ID generator 329 to create a new ID number for another device on a serial interconnection configuration such as daisy chain cascading. The ID generator 329 generates an address for the next device, for example by performing an adding operation for the next device (e.g., +1 operation). More generally, the address generation simply needs to be capable of generating a unique address compared to all of those assigned thus far. While an ID number is being created through each device with the daisy chain, the ID generator 329 generates a new ID that will function as an address for the next device.

In the detailed embodiments described, it is assumed that the ID that is received by a given device is then established as that device's ID. The device generates an ID for the next device. In another embodiment, not described in detail, the ID that is received by a given device is a previous device's ID, and the device generates an ID for itself. Implementation of this alternative embodiment should be readily apparent to one of skill in the art having regard to the other embodiments described herein.

In this embodiment, the system including the plurality of devices 110-1-110-N controlled by the system controller 100 (see FIG. 1) operates mainly with two modes: a "normal mode" and an "ID generation mode". In the normal mode, a data processing circuit 351 performs data access to a memory 357 of a processing circuit 350. In the ID operation mode, the ID is registered in an ID register 335 and another ID is generated by the ID generator 329. The operations of the normal and ID generation will be later described with reference to FIGS. 9A and 9B.

The command interpreter 321 provides a clock latency enable signal 331 to a latency controller 337, a data process control signal 332 to the processing circuit 350, and an ID process enable signal 336 to the ID temporary register 327 and an ID latch controller 333. The clock latency enable signal 331, the data process control signal 332 and the ID process enable signal 336 are provided to convey internal instructions from the command interpreter 321 to the relevant circuits as detailed below. The format of these instructions is implementation specific.

When an ID generation command is decoded and directs that operation, an ID latch controller 333 is enabled by the ID process enable signal 336 and generates a latch signal 334 to store the ID number in the ID register 335. The ID number contained in an ID number signal 328 is output from the ID temporary register 327. The ID is latched by the ID register 335 until power off.

The memory 357 is for example a DRAM, SRAM or flash memory. The data processing circuit 351 receives a registered address signal 353 from the address register 323 and a registered data signal 355 from the data register 325. In response to a data access instruction contained in the data process control signal 332, the data processing circuit 351 performs data access (write and/or read) to the memory 357 for data processing. The processed data is provided by a data output signal 359 to a data packet circuit 341.

For ID generation mode, between two serial packets, there needs to be a time gap between the receipt of a packet by the serial packet interpreter 315 and the output of a packet by the data packet circuit 341 of the previous device, so as to ensure the high speed operation (e.g., over 1 GHz). To meet with the requirement, the serial packet for next device is delayed through the latency controller 337. For example, if a packet needs a 10-cycle delay to avoid the overlapping, the outgoing packet is generated 10 cycles later, in response to the clock latency control signal CLC provided by the system controller 100 (see FIG. 1). The latency controller 337 provides a latency controlled signal 339 to the data packet circuit 341. During ID generation mode, the device needs to prepare a serial packet with the new ID number for the next device. With clock synchronization, a new packet including new ID is produced from the data packet circuit 341 that receives an ID calculated signal 343. An SOP is provided through an output buffer 345.

It can be seen that for the circuit of FIG. 3B, elements 315, 321, 337, 341, 317, 327, 333, 329, 335 are all involved with ID registration and generation. A very specific circuit has been shown to realize these functions and of course it is to be understood that other circuits to realize similar functionality may alternatively be used. Furthermore, circuits 315, 321, 337, 341, 350 combine to provide a very specific implementation of the input/output data processing circuit 360 of FIG. 3A.

Figure 4:
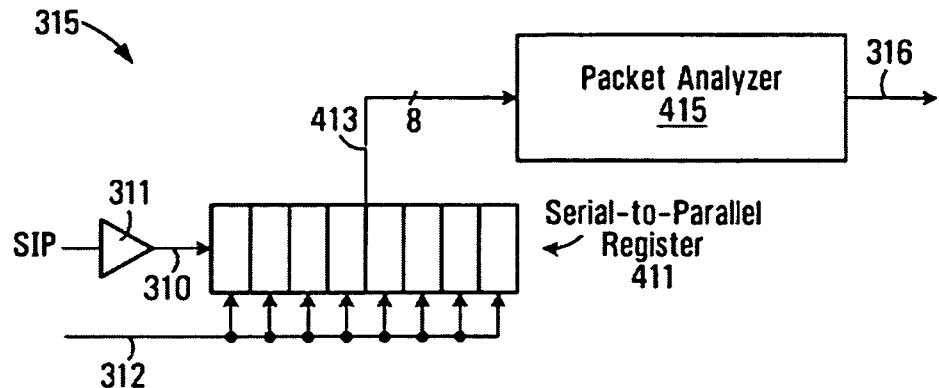
FIG. 4 is a block diagram illustrating a serial packet interpreter shown in FIG. 3B.

FIG. 4 shows an example implementation of the serial packet interpreter 315 shown in FIG. 3B. Referring to FIGS. 3B and 4, a serial-to-parallel register 411 responds to the SIP (or the internal serial input data signal 310) and clock bits of the internal clock signal 312 and provides a command output signal 413 of eight bits to a packet analyzer 415. The packet analyzer 415 determines whether the command bit data in the command output signal 413 is valid or invalid. If the data is valid, the packet analyzer 415 will provide analyzed resultant data as the serial packet interpreted output signal 316. The command data in the serial packet interpreted output signal 316 is fed to the command interpreter 321. The command interpreter 321 includes a command decoder (not shown) to decode the command bits provided from the packet analyzer 415 and provide the clock generation control signal 314 as well as the clock latency enable signal 331, the data process control signal 332 and the ID process enable signal 336. In accordance with the command interpretation, different clock signals are provided for the command interpreter 321, the address register 323, the data register 325 and the ID temporary register 327, in response to the bit information contained in the clock generation control signal 314.

Figure 5:
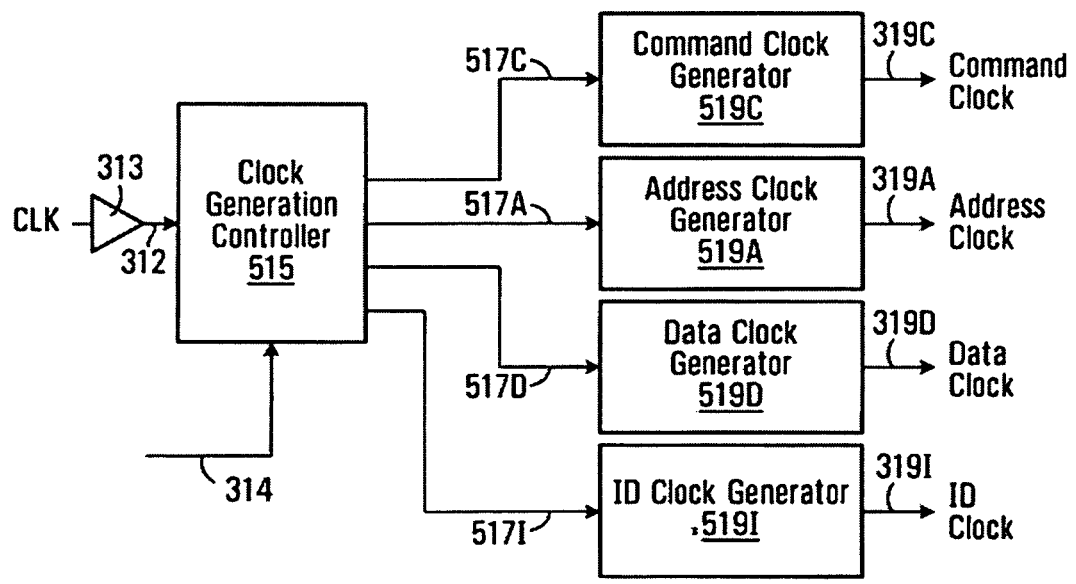
FIG. 5 is a block diagram illustrating a clock producer shown in FIG. 3B.

FIG. 5 shows the clock producer 317 shown in FIG. 3B. Referring to FIG. 5, the clock generation control signal 314 and the clocks of the internal clock signal 312 are fed to a clock generation controller 515 that provides a command clock enable signal 517C, an address clock enable signal 517A, a data clock enable signal 517D and an ID clock enable signal 517I to a command clock generator 519C, an address clock generator 519A, a data clock generator 519D and an ID clock generator 519I, respectively, synchronously with the clock signal CLK. In the normal mode, in response to the command clock enable signal 517C, the address clock enable signal 517A and the data clock enable signal 517D, the command clock generator 519C, the address clock generator 519A and the data clock generator 519D generate the command clock signal 319C, the address clock signal 319A and the data clock signal 319D, respectively, with different timings. In the ID generation mode, in response to the command clock enable signal 517C and the ID clock enable signal 517I, the command clock generator 519C and the ID clock generator 519I generate the command clock signal 319C and the ID clock signal 319I, respectively, with different timings. The clock generation timings in the normal and ID generation modes will be later described with reference to FIGS. 9A and 9B.

Figure 6:
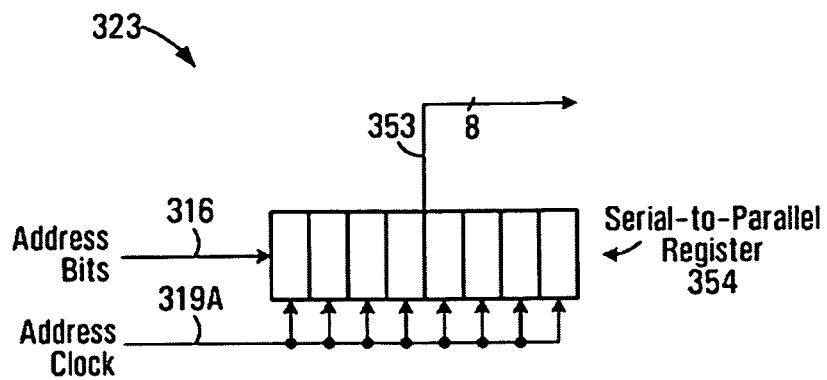
FIG. 6 is a block diagram illustrating an address register shown in FIG. 3B.

FIG. 6 shows the address register 323 shown in FIG. 3B. The address register 323 includes a serial-to-parallel register 354 that registers the address bits contained in the serial input data and outputs eight-bit parallel data 353 in response to the address clock signal 319A.

Figure 7:
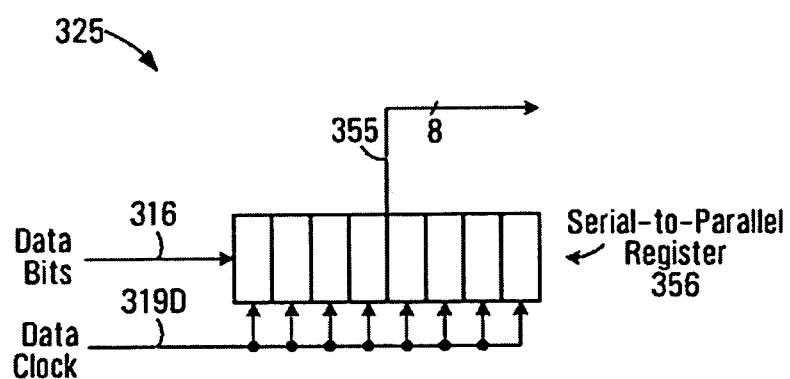
FIG. 7 is a block diagram illustrating a data register shown in FIG. 3B.

FIG. 7 shows the data register 325 shown in FIG. 3B. The data register 325 includes a serial-to-parallel register 356 that registers the data bits contained in the serial input data and outputs eight-bit parallel data 355 in response to the data clock signal 319D.

Figure 8:
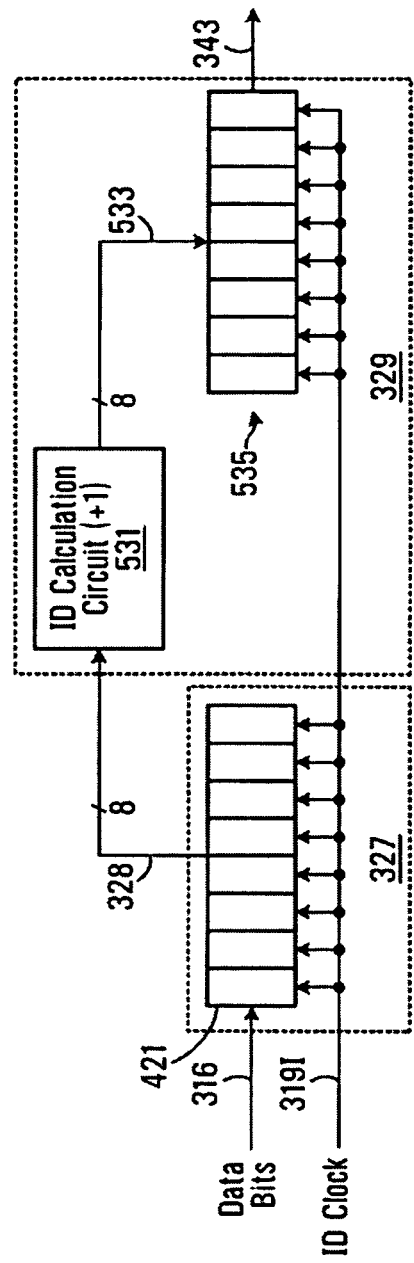
FIG. 8 is a block diagram illustrating an ID temporary register and an ID generator shown in FIG. 3B.

FIG. 8 shows the ID temporary register 327 and the ID generator 329 shown in FIG. 3B. Referring to FIG. 8, the ID temporary register 327 is formed by a serial-to-parallel register 421 that registers the serial packet data contained in the serial packet interpreted output signal 316 and outputs the data in parallel, in response to the clocks of the ID clock signal 319I. The ID generator 329 includes an ID calculation circuit 531 that receives the parallel data of the ID number contained in the ID number signal 328. In this embodiment, the ID calculation circuit 531 performs the calculation of adding one and the calculated ID number is provided by a calculation output signal 533 of eight bits to a parallel-to-serial register 535. The ID clock signal 319I is also fed to the parallel-to-serial register 535 that registers the calculated ID number data. The registered ID number data is shifted out, in response to the clocks of the ID clock signal 319I. The shifted out ID number data is provided as serial data contained in the ID calculated signal 343.

In the embodiment shown in FIGS. 3A and 3B, there is no overlap interval between adjacent devices connected in a daisy chain fashion. Latency provides more time margin to the relevant operations like write and read and makes possible higher frequency operation without the requirement for complicated circuitry, by the use of clock delay function elements with selection switches.

Figure 9A:
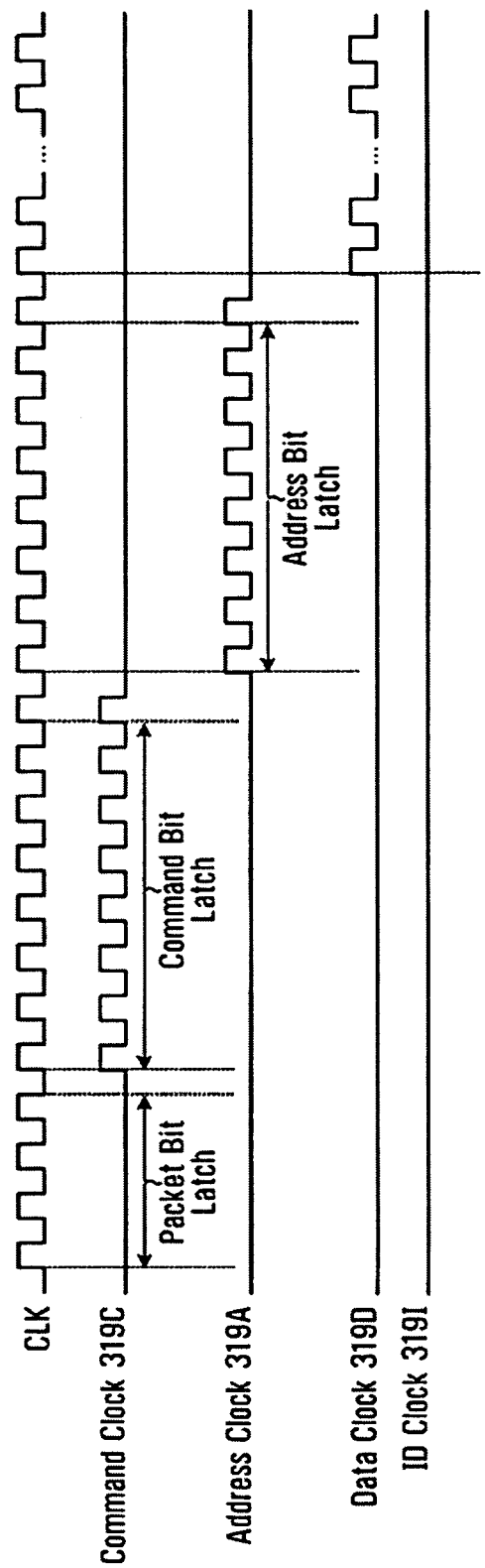
FIG. 9A is an illustration of a timing diagram of a normal operation.
Figure 9B:
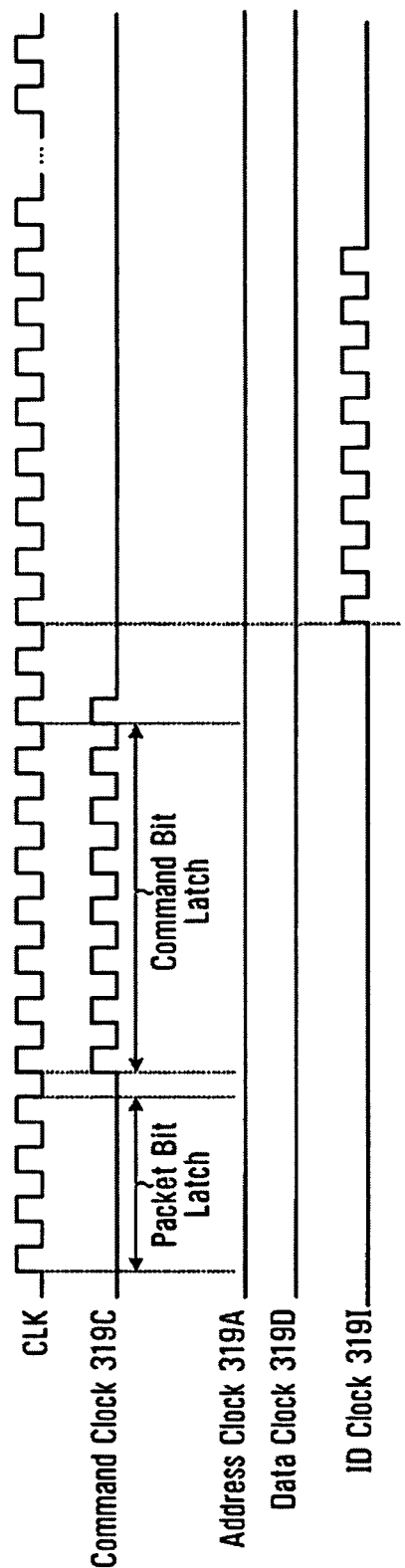
FIG. 9B is an illustration of a timing diagram of an ID generation operation.

FIGS. 9A and 9B show a normal operation and an ID generation operation of the devices, respectively. The modes of normal operation and ID generation are determined by the system controller 100 shown in FIG. 1. Referring to FIGS. 3A, 3B, 5, 9A and 9B, in the normal operation mode shown in FIG. 9A, no ID clocks are required and thus, the clock generation controller 515 does not provide the ID clock enable signal 517I. In response to the clock enable signals from the clock generation controller 515, the command clock signal 319C, the address clock signal 319A and the data clock signal 319D are produced. In response to the clocks, the data processing circuit 351 performs the data process function reads/writes data from/to the memory 357.

In the ID generation mode shown in FIG. 9B, neither address nor data clocks are required and thus, the clock generation controller 515 does not provide the address clock enable signal 517A and the data clock enable signal 517D. The clock generation controller 515 provides the command clock enable signal 517C and the ID clock enable signal 517I. In response to the provided clock enable signals, the command clock signal 319C and the ID clock signal 319I are generated. In the response to the generated clocks, the ID generation is performed by the ID generator 329.

Figure 10:
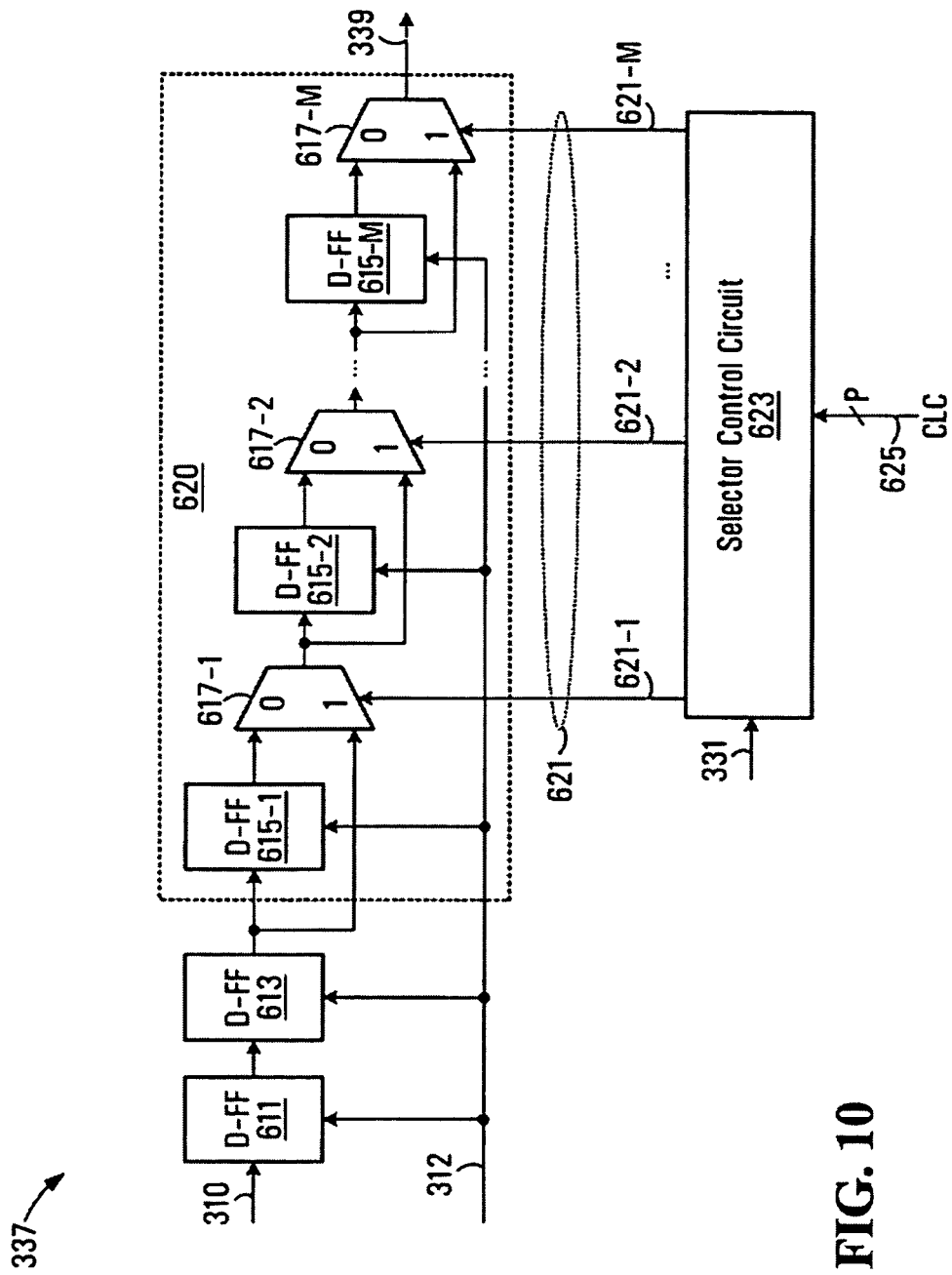
FIG. 10 is a block diagram illustrating a latency controller shown in FIG. 3B.

FIG. 10 shows the latency controller 337 shown in FIG. 3B. The latency controller 337 receives the internal serial input data signal 310, the clock latency enable signal 331 and the internal clock signal 312, and performs the clock latency control in accordance with the CLC input. For normal mode, every additional D-FF is not selected and only default latency with two D-FF is done. For ID generation mode, CLC selects the latency delay by switch control change from a selector control circuit 623.

Referring to FIG. 10, the internal serial input data signal 310 is fed to a first D-type flip flop (D-FF) 611, the output signal of which is provided to a second D-FF 613. The D-FF 613's output signal is fed to a latency adjust circuit 620 that includes D-FFs 615-1-615-M and selectors 617-1-617-M. M is an integer greater than one. M pairs of D-FF and selector are connected in series. The internal clock signal 312 is commonly fed to the clock inputs of the first and second D-FFs 611 and 613 and M D-FFs 615-1-615-M. In the latency adjust circuit 620, the output signal of one D-FF and its input signal are fed to the "0" and "1" inputs of the selector of that pair, respectively. The M selectors 617-1-617-M receive M selection signals 621-1-621-M contained in a selection control signal 621 provided by a selector control circuit 623. The selector control circuit 623 provides the selection control signal 621 in response to the clock latency enable signal 331 and a latency control signal 625 having P bits. P is an integer greater than one and $2^P=M$. The latency control signal 625 is provided by the system controller 100 shown in FIG. 1. The P bit data of the latency control signal 625 is represented by SCD1-SCDP (not shown). In a specific example, the latency control signal 625 includes three bits (P=3), M being eight. The P bit signal is decoded by the selector control circuit 623 and the selection control signal 621 is provided. Thus, the latency adjust circuit 620 has eight D-FFs and eight selectors. Following Table I shows the latency controlled by the latency control signal 625.

TABLE I

| Clock Latency Control Signal Bits | | | Number of Selectors | Controlled Latency |
|---|---|---|---|---|
| SCD1 | SCD2 | SCD3 | Selected by SCD - SCD3 | (clock cycles) |
| 0 | 0 | 0 | 0 | N/A |
| 1 | 0 | 0 | 1 | 1 |
| 0 | 1 | 0 | 2 | 2 |
| 0 | 0 | 1 | 3 | 3 |
| 1 | 1 | 0 | 4 | 4 |
| 0 | 1 | 1 | 5 | 5 |
| 1 | 0 | 1 | 6 | 6 |
| 1 | 1 | 1 | 7 | 7 |

In the example shown in FIG. 10, two D-FFs 611 and 613 provide "fixed" delay of two cycles. Other fixed delays can alternatively be implemented. The latency adjust circuit 620 provides an "additional" delay of adjustable and selectable cycles. In a case where three cycle delay is required, the additional delay is one cycle and thus, only one selector (e.g., the first selector 615-1) is chosen to be "0" and the delay by one D-FF (e.g., the D-FF 615-1) is utilized. In a case where the clock latency enable signal 331 is disabled when no ID command interpretation is made, the latency controller 337 provides the fixed delay.

Figure 11:
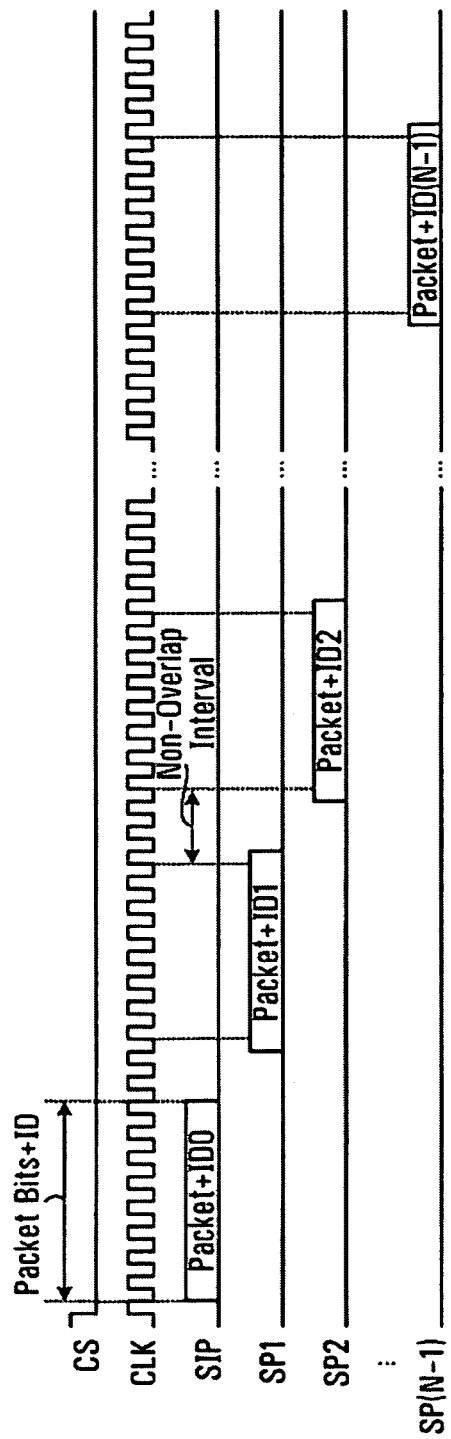
FIG. 11 is an illustration of a timing diagram of an ID generation with high frequency clock.

FIG. 11 shows signal timings of ID generation with high frequency clock. As shown in FIG. 11, the key point of the technique is to keep enough clock time margin to allow internal ID generating operation, before sending all serial packet bit streams to the next device. As described above, the latency (clock cycles) is controlled by the P bits of the latency control signal 625 provided by the system controller 100. In some implementations, the latency control bits are determined during device specification, and the latency control bits for ID generation mode are not changed after device specification has been fixed.

Referring to FIGS. 1-11, the data on SIP contains packet bits and ID that is fed to the serial input port (SIP) of the first device 110-1. As shown in FIG. 1, the identical devices are serially interconnected (serially linked or daisy chained) and serial input port (SIP) data is processed and is outputted as serial output port (SOP) data. Due to the nature of the serial interconnection, an intended device for receipt of serial data needs to be identified for data processing. Such an identifier is attached to the serial data as an ID. The ID for the first device is provided by the system controller 100. The ID for the first device might for example be '00h'. The size of the ID depends on the requirements of the system and the number of devices connected in daisy chain fashion. Then, the first device 110-1 provides SP1 from its serial output port (SOP), the SP1 being fed to the second device 110-2. Similarly, the second device 110-2 provides SP2 to the third device 110-3. As such, each device receives an SIP data and provides an SOP to its neighboring device. The Nth device provides SPN (SOP). A general bit structure of the packet bits+ID is "packet start+ID generation command+ID+packet end". Thus, the SIP and the provided SP's are by given by:

SIP: Packet+ID0=Packet start+ID generation command+'0.000'+Packet end

SP1: Packet+ID1=Packet start+ID generation command+'0.001'+Packet end

SP2: Packet+ID2=Packet start+ID generation command+'0.010'+Packet end

SPN: Packet+ID(N-1)=Packet start+ID generation command+'1.110'+Packet end.

Bit configuration of serial input packet is packet start bits+first bits (command, any bit sizes depending on the system requirement and memory operation modes)+ID values (several bits)+packet end (optional).

Figure 12:
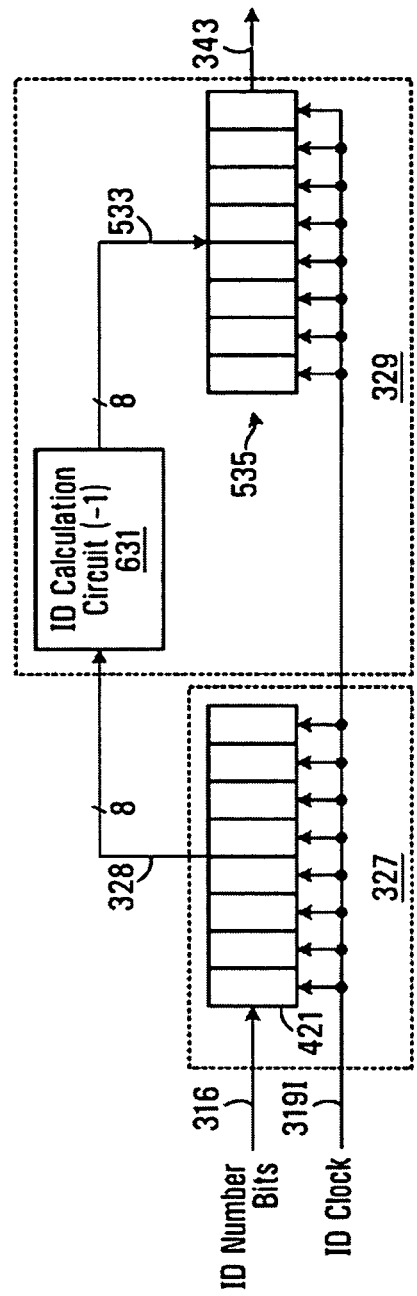
FIG. 12 is a block diagram illustrating another example of an ID temporary register and an ID generator.

FIG. 12 shows another example of the ID temporary register and the ID generator shown in FIG. 3B. Referring to FIG. 12, the ID calculation circuit 631 is a subtractor (e.g., −1 operation), instead of an adder. In the case of the subtractor, the newly generated ID is for the downward device. More generally, as described previously, subsequent addresses can be generated in any manner that ensures a set of unique addresses.

Figure 13:
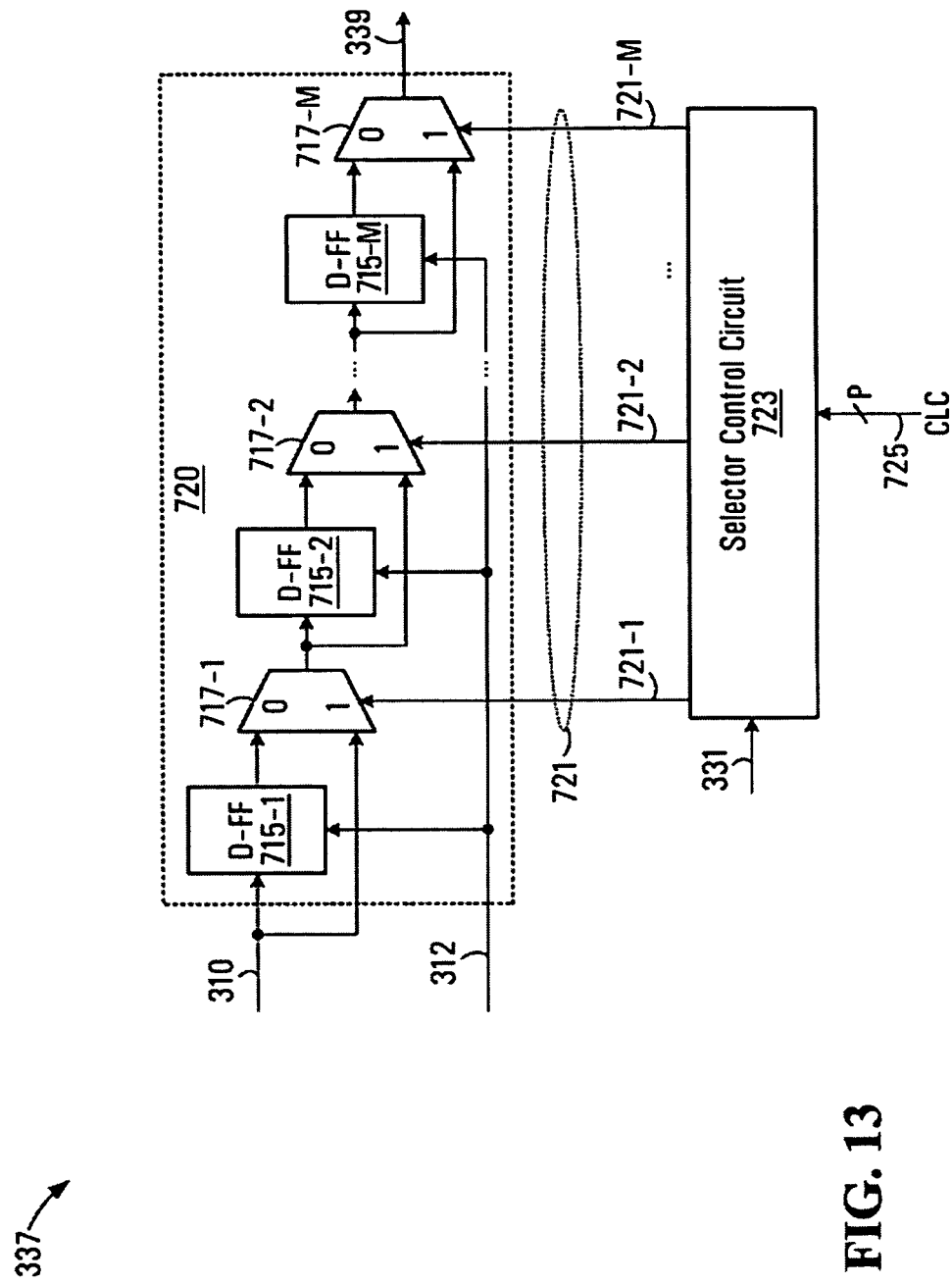
FIG. 13 is a block diagram illustrating another example of a latency controller.

FIG. 13 shows another example of the latency controller 337 shown in FIG. 3B. Referring to FIG. 13, the latency controller includes no D-FFs at the input stage of the latency adjust circuit, i.e., no "fixed" delay. A latency adjust circuit 720 includes D-FFs 715-1-715-M and selectors 717-1-717-M that are interconnected in a similar manner to that of FIG. 10. In this example, in accordance with the P bit data of a clock latency control signal 725, the latency adjust circuit 720 varies the entire of the clock latency. In response to the clock latency control signal 725 provided by the system controller 100 shown in FIG. 1, a selector control circuit 723 decodes it and provides a selection control signal 721 containing M selection signals 721-1-721-M to the selectors 717-1-717-M. In this example, the system controller 100 provides the clock latency control signal 725 containing information bits to achieve the 'fixed' or "minimum" delay, when no ID command interpretation is made.

Packet based operations typically contain packet start and end and include command bits to accomplish an expected operation based on serial stream data transmission to a packet data interpreter in each device. ID generation command is just one of type of command suitable for use with sets of daisy chain devices. Typical implementations will include functional blocks (not shown) that may be defined on an implementation specific basis to perform the processing of other input command types.

In the embodiment described, a single data rate (SDR) interface is adopted as the interface type of the system and the rising edge of clock latches input data. In case of a double data rate (DDR) interface type, both edges of the clock are used to latch input streams to speed up the write and read operations. Furthermore, other types of interfaces such as QDR (quadruple data rate) and the like may be employed.

In the embodiment described above, the device elements and circuits are connected to each other as shown in the figures, for the sake of simplicity. In practical applications of the techniques to memory systems, devices, elements, circuits, etc. may be connected or coupled directly to each other. As well, devices, elements, circuits etc. may be connected or coupled indirectly to each other through other devices, elements, circuits, etc., as necessary for operation of the memory systems.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. An apparatus comprising a plurality of devices in a serial interconnection configuration, each of the plurality of devices having input and output connections, the serial interconnection configuration including at least first and second devices, the output connection of the first device being coupled to the input connection of the second device, the first device comprising:
   a packet based processor comprising a clock producer responsive to an input clock to produce first and second clocks at different times, the packet based processor being configured:
   to receive a first packet containing at least one packet start bit, an operation command for device identification production and a first device identifier number;
   to interpret the operation command contained in the received first packet in synchronization with the first clock;
   to produce a second device identifier number based on the first device identifier number in response to the at least one packet start bit contained in the received first packet and the interpreted operation command in synchronization with the second clock; and
   to transfer a second packet containing the second device identifier number to the second device in synchronization with the input clock.

2. The apparatus of claim 1, wherein the packet based processor of the first device further comprises:
   an input circuit for receiving the first packet through the input connection; and
   an output circuit for outputting the second packet through the output connection to the second device.

3. The apparatus of claim 2, wherein the packet based processor of the first device further comprises:
   an interpreter for interpreting the operation command contained in the first packet received through the input connection to provide the interpreted operation command.

4. The apparatus of claim 3, wherein the packet based processor of the first device further comprises:
   a device identification producer for performing a calculation based on the first device identification number to produce the second device identification number in accordance with the interpreted operation command.

5. The apparatus of claim 4, wherein the device identification producer comprises:
   a calculator for adding a predetermined increment value to the first device identification number to provide the second device identification number.

6. The apparatus of claim 4, wherein the device identification producer comprises:
   a calculator for subtracting a predetermined decrement value to the first device identification number to provide the second device identification number.

7. The apparatus of claim 1, wherein the first device further comprises:
   a device controller for controlling a clock latency of the first packet in response to the input clock and a clock latency control signal to control the clock latency of the output of the second packet such that there is a time gap between receiving the first packet and the transmission of the second packet.

8. The apparatus of claim 7, wherein the device controller comprises:
   a clock delay element including a series-connected selectable time delay circuits; and
   a selector for selecting a combination of the selectable time delay circuits, in response to the latency control signal.

9. The apparatus of claim 8, wherein the device controller further comprises:
   at least one clock delay element that does not require selection and introduces a fixed delay.

10. The apparatus of claim 7, further comprising:
    a controller configured to control operation of the serial interconnection of the devices, the controller providing the latency control signal.

11. The apparatus of claim 1, wherein each of the plurality of devices comprises a memory for storing data.

12. The apparatus of claim 11, wherein each of the plurality of devices includes a DRAM, an SRAM or flash memory.

13. The apparatus of claim 1, wherein the packet based processor of the first device further comprises an assignor for assigning either of the first device identification number contained in the first packet or the produced second device identification number as a device identification of that device.

14. The apparatus of claim 13, wherein the packet based processor of the first device further comprises a register for storing the assigned device identification number of that device.

15. A method for producing a device identifier in a serial interconnection configuration including a plurality of devices in a serial interconnection configuration, each of the plurality of devices having input and output connections, the serial interconnection configuration including at least first and second devices, the output connection of the first device being coupled to the input connection of the second device, the method comprising:
producing first and second clocks at different times in response to an input clock;
receiving a first packet containing at least one packet start bit, an operation command and a first device identifier number;
interpreting the received operation command to produce an interpreted operation command in synchronization with the first clock;
producing a second device identifier number based on the first device identifier number in response to the at least one packet start bit contained in the received first packet and the interpreted operation command in synchronization with the second clock; and
transferring a second packet containing the second device identifier number to the second device in synchronization with the input clock.

16. The method of claim 15, wherein the producing a second device identifier number comprises:
performing a calculation based on the first device identification number to produce the second device identification number in accordance with the interpreted operation command.

17. The method of claim 16, wherein the performing a calculation comprises:
adding a predetermined increment value to the first device identification number to provide the second device identification number.

18. The method of claim 16, wherein the step of interpreting comprises:
subtracting a predetermined decrement value to the first device identification number to provide the second device identification number.

19. The method of claim 15, further comprising:
controlling a clock latency in response to the first packet and the clock to provide a clock latency control signal, the clock latency control signal controlling the output of the second packet such that there is a time gap between receiving the first packet and the transmission of the second packet.

20. The method of claim 16, further comprising:
assigning either of the first device identification number contained in the first packet or the produced second device identification number as a device identification of that device.

21. The method of claim 20, further comprising:
storing the assigned device identification number of that device.

* * * * *

UNITED STATES PATENT AND TRADEMARK OFFICE
CERTIFICATE OF CORRECTION

PATENT NO. : 8,700,818 B2
APPLICATION NO. : 11/529293
DATED : April 15, 2014
INVENTOR(S) : Hong Beom Pyeon et al.

Page 1 of 1

It is certified that error appears in the above-identified patent and that said Letters Patent is hereby corrected as shown below:

In the Specification

Column 12, Lines 53 to 59:

SIP: Packet + ID0
 =Packet start + ID generation command + '0.000' + Packet end
SP1: Packet + ID1
 = Packet start + ID generation command + '0.001' + Packet end
SP2: Packet + ID2
 = Packet start + ID generation command + '0.010' + Packet end
SPN: Packet + ID(N-1)
 = Packet start + ID generation command + '1.110' + Packet end.

should read --

SIP: Packet + ID0
 =Packet start + ID generation command + '0..000' + Packet end
SP1: Packet + ID1
 = Packet start + ID generation command + '0..001' + Packet end
SP2: Packet + ID2
 = Packet start + ID generation command + '0..010' + Packet end
SPN: Packet + ID(N-1)
 = Packet start + ID generation command + '1..110' + Packet end.

Signed and Sealed this
Twenty-third Day of September, 2014

Michelle K. Lee
*Deputy Director of the United States Patent and Trademark Office*